United States Patent
Norimatsu et al.

(10) Patent No.: US 10,615,715 B2
(45) Date of Patent: Apr. 7, 2020

(54) POWER CONVERSION DEVICE, COOLING STRUCTURE, POWER CONVERSION SYSTEM, AND POWER SUPPLY DEVICE

(71) Applicant: Hitachi, Ltd., Chiyoda-ku, Tokyo (JP)

(72) Inventors: Yasuaki Norimatsu, Tokyo (JP); Akihiko Kanouda, Tokyo (JP); Yuuichi Mabuchi, Tokyo (JP); Takae Shimada, Tokyo (JP); Mitsuhiro Kadota, Tokyo (JP); Yuki Kawaguchi, Tokyo (JP); Mizuki Nakahara, Tokyo (JP); Akira Yonekawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/307,661

(22) PCT Filed: Sep. 6, 2016

(86) PCT No.: PCT/JP2016/076150
§ 371 (c)(1),
(2) Date: Dec. 6, 2018

(87) PCT Pub. No.: WO2018/047229
PCT Pub. Date: Mar. 15, 2018

(65) Prior Publication Data
US 2019/0199238 A1    Jun. 27, 2019

(51) Int. Cl.
*H02M 7/00* (2006.01)
*H02M 7/49* (2007.01)
(Continued)

(52) U.S. Cl.
CPC ......... *H02M 7/49* (2013.01); *H02M 3/33569* (2013.01); *H02M 7/003* (2013.01);
(Continued)

(58) Field of Classification Search
CPC ... H02M 2001/0067; H02M 2001/007; H02M 2001/008; H02M 7/003; H02M 7/49;
(Continued)

(56) References Cited

U.S. PATENT DOCUMENTS

| 2013/0279215 A1* | 10/2013 | Skjellnes | H02M 1/32 363/37 |
| 2013/0343089 A1* | 12/2013 | Gupta | H02M 7/4807 363/16 |

(Continued)

FOREIGN PATENT DOCUMENTS

| JP | 53-1823 A | 1/1978 |
| JP | 2004-357436 A | 12/2004 |

(Continued)

OTHER PUBLICATIONS

International Search Report (PCT/ISA/210) issued in PCT Application No. PCT/JP2016/076150 dated Dec. 6, 2016 with English translation (seven (7) pages).

(Continued)

*Primary Examiner* — Alex Torres-Rivera
(74) *Attorney, Agent, or Firm* — Crowell & Moring LLP

(57) ABSTRACT

In a power conversion device, a power conversion unit includes a single-phase inverter on a secondary side of a resonant type converter that has an input of a direct current. A power conversion unit group is configured by connecting outputs of the single-phase inverters of a plurality of power conversion units in series. Respective phases of three phase alternate current are formed with the three power conversion unit groups housed in a power conversion device housing. The plurality of power conversion units constituting the power conversion unit group are disposed along a longitudinal direction of the power conversion device housing. The respective three power conversion unit groups are disposed at an upper stage, a middle stage, and a lower stage in a (Continued)

height direction of the power conversion device housing. The power conversion device housing has one end side in the longitudinal direction as output terminals of the three power conversion unit groups. The power conversion device housing has the other end side in the longitudinal direction where terminals of the three power conversion unit groups are connected in common.

9 Claims, 16 Drawing Sheets

(51) Int. Cl.
*H02M 7/48* (2007.01)
*H05K 7/20* (2006.01)
*H02S 40/32* (2014.01)
*H02M 3/335* (2006.01)
*H02M 7/493* (2007.01)
*H05K 7/14* (2006.01)
*H02M 1/00* (2006.01)
*H02M 7/487* (2007.01)
*H02M 3/28* (2006.01)

(52) U.S. Cl.
CPC ......... *H02M 7/4807* (2013.01); *H02M 7/493* (2013.01); *H02S 40/32* (2014.12); *H05K 7/209* (2013.01); *H05K 7/20909* (2013.01); *H02M 3/285* (2013.01); *H02M 7/487* (2013.01); *H02M 2001/0058* (2013.01); *H02M 2001/0077* (2013.01); *H05K 7/1432* (2013.01); *H05K 7/20936* (2013.01)

(58) Field of Classification Search
CPC ........... H02M 7/4807; H02M 3/33569; H02M 7/493; H02M 2001/0077; H02M 7/487; H02M 3/285; H02M 2001/0058; H05K 7/20909; H05K 7/209; H05K 7/1432; H05K 7/20936; H02S 40/32
See application file for complete search history.

(56) References Cited

U.S. PATENT DOCUMENTS

| 2015/0188315 A1* | 7/2015 | Hytten | H02J 4/00 307/18 |
| 2016/0276964 A1* | 9/2016 | Zushi | B60L 15/007 |
| 2018/0198377 A1* | 7/2018 | Keister | H02M 1/08 |

FOREIGN PATENT DOCUMENTS

| JP | 2006-223100 A | 8/2006 |
| JP | 2011-55670 A | 3/2011 |

OTHER PUBLICATIONS

Japanese-language Written Opinion (PCT/ISA/237) issued in PCT Application No. PCT/JP2016/076150 dated Dec. 6, 2016 (six (6) pages).

* cited by examiner

POWER CONVERSION DEVICE, COOLING STRUCTURE, POWER CONVERSION SYSTEM, AND POWER SUPPLY DEVICE

TECHNICAL FIELD

The present invention relates to a power conversion device, a cooling structure, a power conversion system, and a power supply device.

BACKGROUND ART

To interconnect an electric power generated at a power generation facility that uses a natural energy, for example, solar power generation and wind power generation, to an electric power system, a power conversion device is used. The power conversion device converts a voltage and a frequency into those of the electric power in the electric power system. The power conversion device includes a plurality of power conversion devices that perform power conversion between DC power and AC power, and the power conversion device is configured to include an insulation transformer and a power convertor such as a DC/DC converter and an inverter.

Generally, for example, in the case of a solar PCS for large-scale, a direct current from the solar power generation facility serves as an input to output a three-phase power of about 400 V. A high-voltage insulation transformer is used for a step-up output from the solar PCS to a high-voltage system (for example, 6.6 kV and 22 kV), and the high-voltage insulation transformer is forced to be driven with a low frequency of several tens of Hz identical to the frequency of the system, thus increasing in size. To achieve an outdoor installation of a PCS for large capacity, it is necessary to house the solar PCS inside a container or to adapt the solar PCS itself for outdoor on-board use, thus upsizing the facility.

While further loss reduction is ensured by shortening lengths of a DC wiring and a low-voltage AC wiring, it is difficult to dispose the solar PCS and an interconnection transformer immediately close to a solar panel in view of influence of a shade on the solar panel because of the large volume and weight of the solar PCS for outdoor use and the interconnection transformer as described above. Then, the solar PCS and the interconnection transformer have been generally disposed away from the solar panel.

PTL 1 has been known as a case where a power conversion device is disposed in association with a transformer board when configuring the power conversion device on board.

PTL 1 discloses that the power conversion device "includes: an input transformer 1 that includes a plurality of secondary windings; a transformer board 10 that houses this input transformer 1; a three-phase inverter that is connected to the secondary winding in a one-to-one basis and has respective phases in Y-connection, the phases each including a plurality of unit inverters 2 connected in series, the unit inverters each outputting a single-phase AC voltage in a desired frequency; and a converter board 20 that houses the unit inverters 2 constituting the three-phase inverter. The converter boards 20 includes a plurality of support pillars 22 made of insulators, and a plurality of metallic shelf boards 23 that fasten adjacent support pillars one another among this plurality of support pillars 22 in a lateral direction. The respective unit inverters 2 are placed and secured to the shelf boards 23."

CITATION LIST

Patent Literature

PTL 1: Japanese Patent Application Laid-Open No. 2004-357436

SUMMARY OF INVENTION

Technical Problem

However, since both input and output of the converter board 20 are performed with high voltages, an insulation distance is required to take a neutral point, thus it is difficult to achieve size reduction of the power conversion device.

In view of the above-described problems, it is an object of the present invention to provide a power conversion device, a power conversion system, a power supply device, and a highly efficient cooling structure in which the power conversion device is configured to achieve the size reduction.

Solution to Problem

In view of the above-described problems, the present invention provides, for example, a power conversion device. In the power conversion device, a power conversion unit includes a single-phase inverter on a secondary side of a resonant type converter that has an input of a direct current. A power conversion unit group is configured by connecting outputs of the single-phase inverters of a plurality of the power conversion units in series. Respective phases of three phase alternate current are formed with the three power conversion unit groups housed in a power conversion device housing. The plurality of power conversion units constituting the power conversion unit group are disposed along a longitudinal direction of the power conversion device housing. The respective three power conversion unit groups are disposed at an upper stage, a middle stage, and a lower stage in a height direction of the power conversion device housing. The power conversion device housing has one end side in the longitudinal direction as an output terminal for the three power conversion unit groups. The power conversion device housing has the other end side in the longitudinal direction where terminals of the three power conversion unit groups are connected in common.

Advantageous Effects of Invention

The present invention has an object to provide a power conversion device, a power conversion system, and a highly efficient cooling structure that are configured to achieve the size reduction.

DESCRIPTION OF EMBODIMENTS

Figure 1:
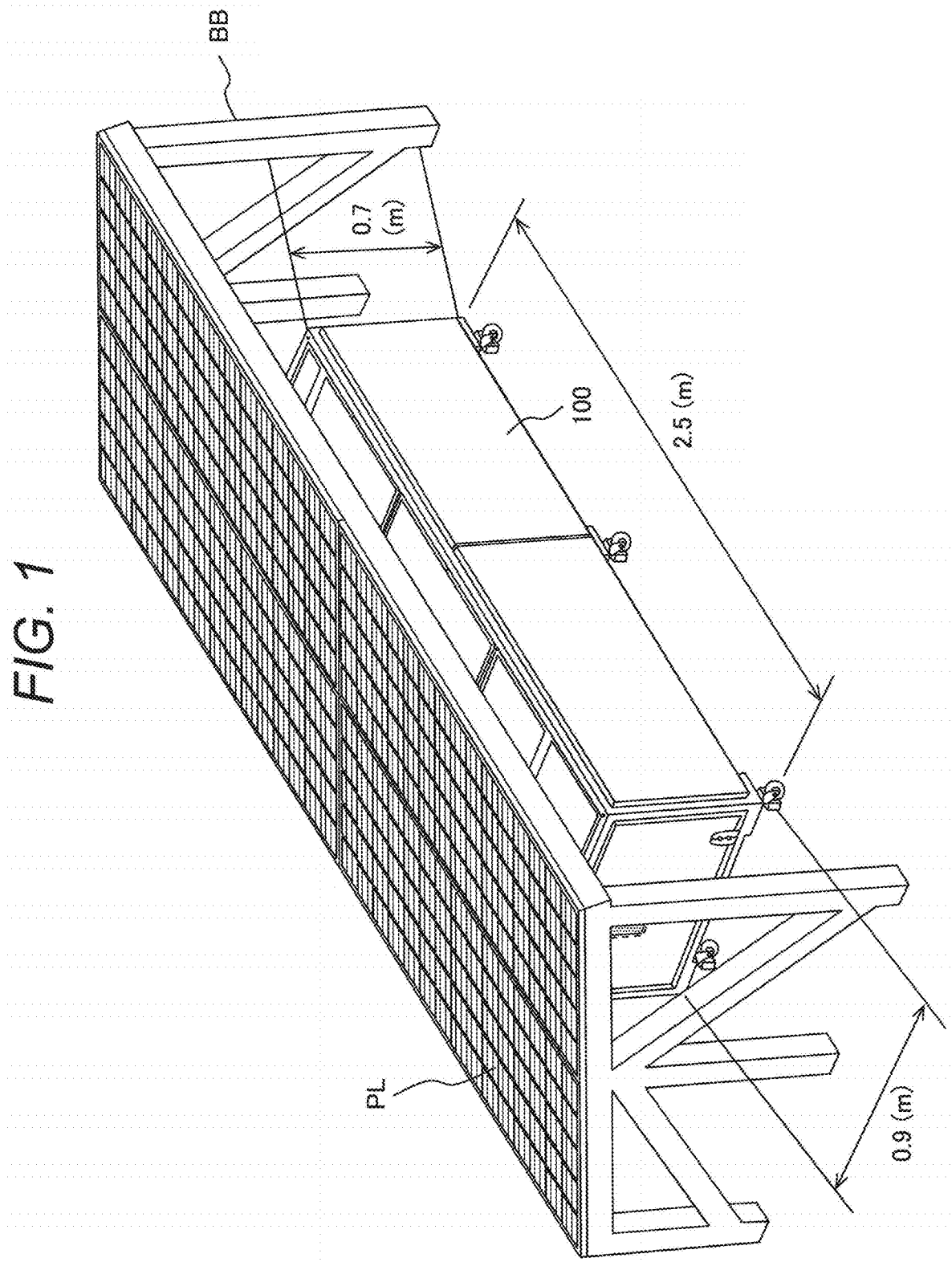
FIG. 1 is a drawing illustrating a housing of a power conversion device according to the present invention and an arrangement position relationship.

The following describes a power conversion device of the present invention by referring to the drawings.

Example 1

FIG. 1 is a drawing illustrating a housing of a power conversion device according to the present invention and an arrangement position relationship. A power conversion device housing 100 of the present invention is installed using a space formed by a solar panel PL and a base BB. The solar panel PL is mounted to and supported by the base BB. Therefore, the power conversion device housing 100 is disposed at a well-ventilated position without a direct sunlight. The box-shaped housing has a box shape extending in a longitudinal direction. Incidentally, the housing has a size: a length in the longitudinal direction of 2.5 (m) for example, a length in a short side direction of 0.9 (m) for example, a height of 0.7 (m) for example. The housing can be disposed in a shaded space formed by the solar panel PL and the base BB.

Figure 2:
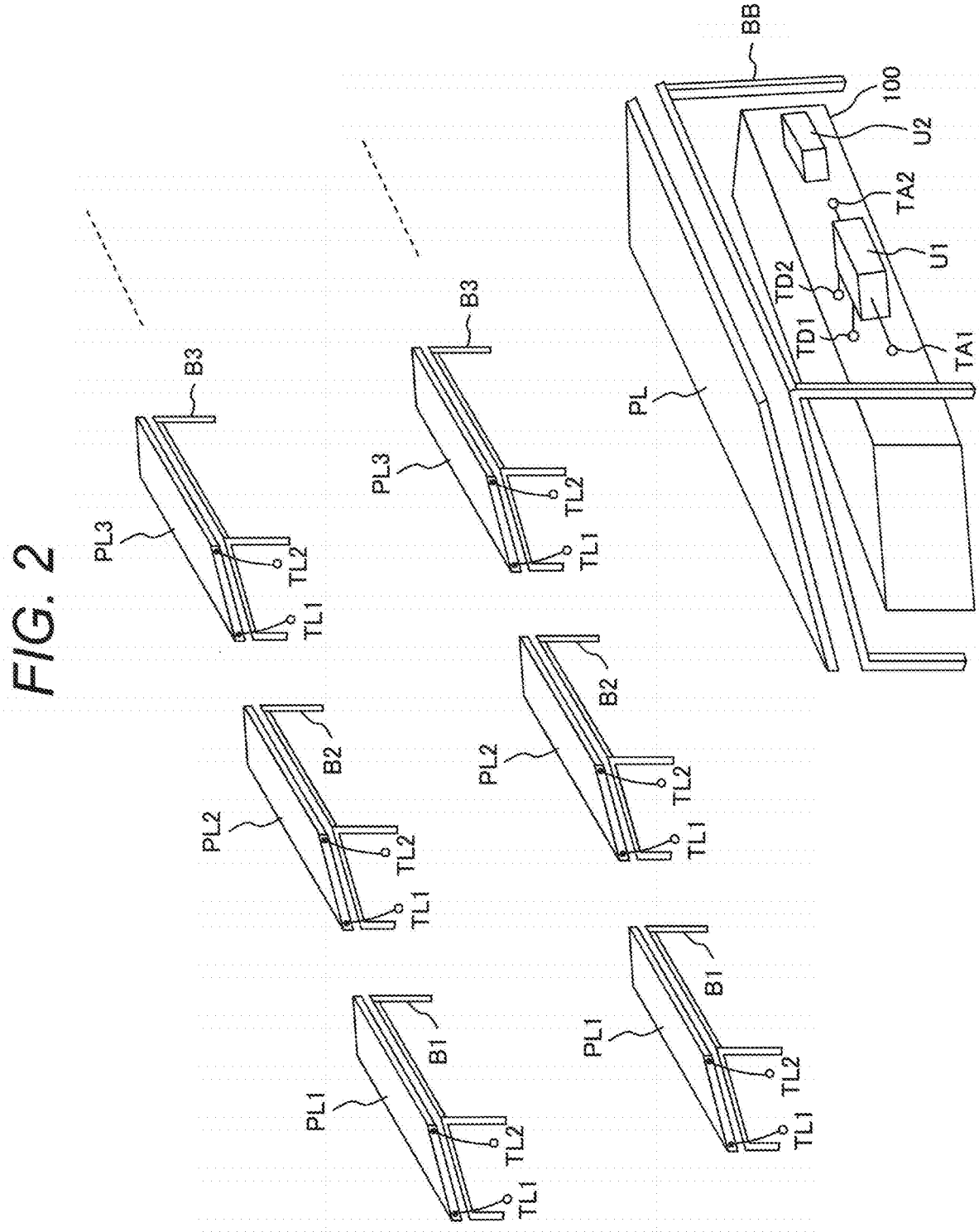
FIG. 2 is a drawing illustrating an exemplary solar power generation site to which the power conversion device of the present invention is applied.

FIG. 2 illustrates an exemplary solar power generation site to which the power conversion device of the present invention is applied.

The solar power generation site in FIG. 2 includes a plurality of the solar panels PL, which are mounted to and supported by bases B, DC outputs of the respective solar panels PL are obtained between terminals TD1 and TD2. This solar power generation site has lower spaces of the bases BB used for installing the power conversion device housings 100 in FIG. 1 for converting the DC outputs of the solar panels PL into three-phase AC in an electric power system. As described later, the box-shaped power conversion device housing 100 houses a plurality of power conversion units U (U1 and U2 in illustration), and the power conversion units U each include DC input terminals TD1 and TD2 connected to DC output terminals TL1 and TL2 of each solar panel PL, and AC output terminals TA1 and TA2. The DC output terminals TL1 and TL2 of the solar panel PL1 are matched and connected to, for example, the DC input terminals TD1 and TD2 of the power conversion unit UT, and the DC output terminals TL1 and TL2 of the solar panel PL2 are matched and connected to, for example, the DC input terminals TD1 and TD2 of the power conversion unit U2. Alternatively, the DC output terminals TL1 and TL2 of a plurality of solar panels PL are connected in common, and connected to the DC input terminals TD1 and TD2 of the power conversion unit U, respectively.

Figure 3:
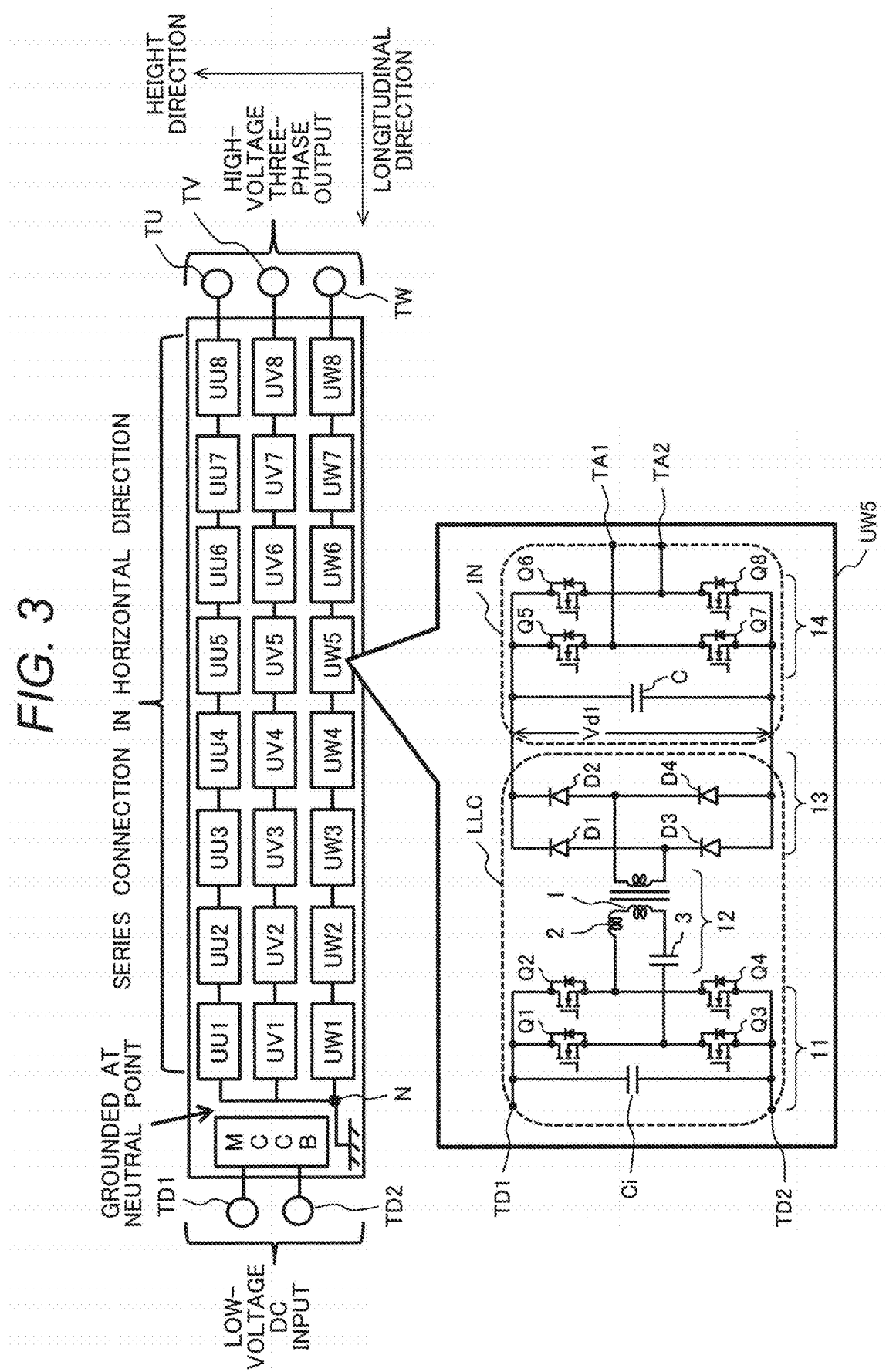
FIG. 3 is a drawing illustrating an exemplary connection of a plurality of power conversion units U in a power conversion device housing 100.

FIG. 3 illustrates an exemplary connection of the plurality of the power conversion units U in the power conversion device housing 100.

The power conversion device housing 100 is externally connected through DC input terminals TD1 and TD2 connected to the DC output terminals TL1 and TL2 of the plurality of the solar panels PL and three-phase AC output terminals TU, TV, and TW connected to respective phases of a high voltage three-phase electric power system. A low-voltage DC input is applied to the DC input terminals TD1 and TD2, and a high-voltage three-phase output is obtained from the three-phase AC output terminals TU, TV, and TW.

The three-phase AC output is configured with a Y-connection grounded at a neutral point N, and the box-shaped power conversion device housing 100 has one end side in the longitudinal direction where the three-phase AC output terminals TU, TV, and TW are aggregately arranged while the cube-shaped power conversion device housing 100 has the other end side in the longitudinal direction where the neutral point N is disposed. While the disposing locations of the DC input terminals TD1 and TD2 are not specifically limited, the drawing illustrates an example where the DC input terminals TD1 and TD2 are disposed on the neutral point N side on the other end side of the box-shaped power conversion device housing 100 in the longitudinal direction. The drawing illustrates an example where a DC breaker MCCB is installed at the DC input terminals TD1 and TD2. The drawing illustrates an example where the DC output terminals TL1 and TL2 of a plurality of solar panels PL are connected in common, and connected to the DC input terminals TD1 and TD2 commonly disposed at the power conversion units U, respectively.

In the power conversion device housing 100, the phases between the three-phase AC output terminals TU, TV, and TW and the neutral point N each include a plurality of power conversion units U. In the example in the drawing, the phases each include eight power conversion units U, and in exemplifying with a W-phase, a UW1, a UW2, a UW3, a UW4, a UW5, a UW6, a UW7, and a UW8 are sequentially disposed from the neutral point N side. This arrangement applies to other phases.

In the power conversion device housing 100, the phases each include the eight power conversion units U as a power conversion unit group, and the multiple stages of the power conversion unit groups are disposed in a height direction of the power conversion device housing 100. The example in the drawing employs a three-stage layered structure where, for the power conversion unit groups of the respective phases of U, V, and W, the U-phase is disposed at a lower stage, the V-phase is disposed at a middle stage, and the W-phase is disposed at an upper stage.

FIG. 3 illustrates an exemplary configuration of the UW5 as a specific circuit configuration of the power conversion unit U. Other power conversion units U have the identical configurations, and therefore only the configuration of the UW5 will be described here. The power conversion unit UW5 includes an LLC resonant converter LLC and an inverter IN.

Among them, the LLC resonant converter LLC includes an input side capacitor Ci, an inverter circuit 11 with a full bridge configuration including semiconductor devices Q1, Q2, Q3, and Q4, an insulation transformer 12 where an excitation inductance 1, a leakage inductance 2, and a resonant capacitor 3 are connected in series, and a rectifier circuit 13 with a full bridge configuration including diodes D1, D2, D3, and D4. The LLC resonant converter LLC converts the DC input from the solar panel PL into a high-frequency AC, and subsequently, converts the high-frequency AC into a DC again.

The inverter IN includes a capacitor C and an inverter circuit 14 with a full bridge configuration including semiconductor devices Q5, Q6, Q7, and Q8. With this configuration, an AC voltage is generated with a DC voltage Vd1 provided from the LLC resonant converter LLC as a power source. Thus, the power conversion unit UW5 is configured such that its input is connected to the direct current from the solar panel PL and its output is connected to a high-voltage system side.

In the power conversion unit UW5, among the AC output terminals TA1 and TA2, the terminal TA1 on a high voltage side is connected to the AC output terminal TA2 of the adjacent power conversion unit UW6 on the high voltage side, and the terminal TA2 on a low-voltage side is connected to the AC output terminal TA1 of the adjacent power conversion unit UW4 on the low-voltage side. Thus, the plurality of power conversion units U constituting each of the phases have the input sides connected in parallel and the output sides connected in series, so as to share the output of the high voltage to the electric power system.

The power conversion device housing 100 includes the plurality of power conversion units U, which have the configurations as illustrated in FIG. 3, disposed in each of the phases while employing the three-stage layered structure. While FIG. 4 also illustrates an exemplary arrangement of the power conversion units U in the power conversion device housing 100, FIG. 4 is different from FIG. 3 only in that AC breakers are disposed at the respective phases on the output side of the power conversion device.

Figure 4:
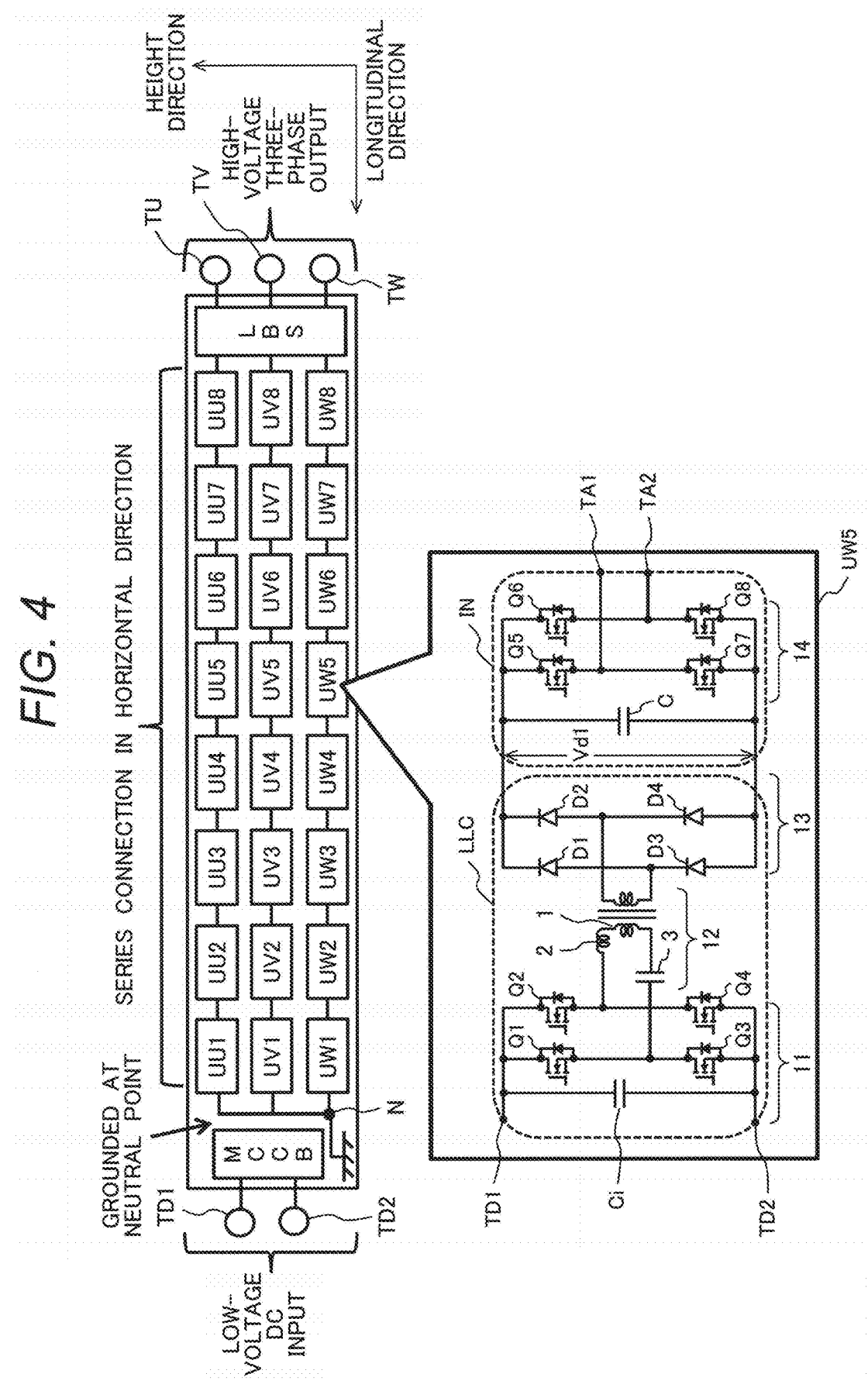
FIG. 4 is a drawing illustrating another example of the connection of the plurality of power conversion units U in the power conversion device housing 100.
Figure 5:
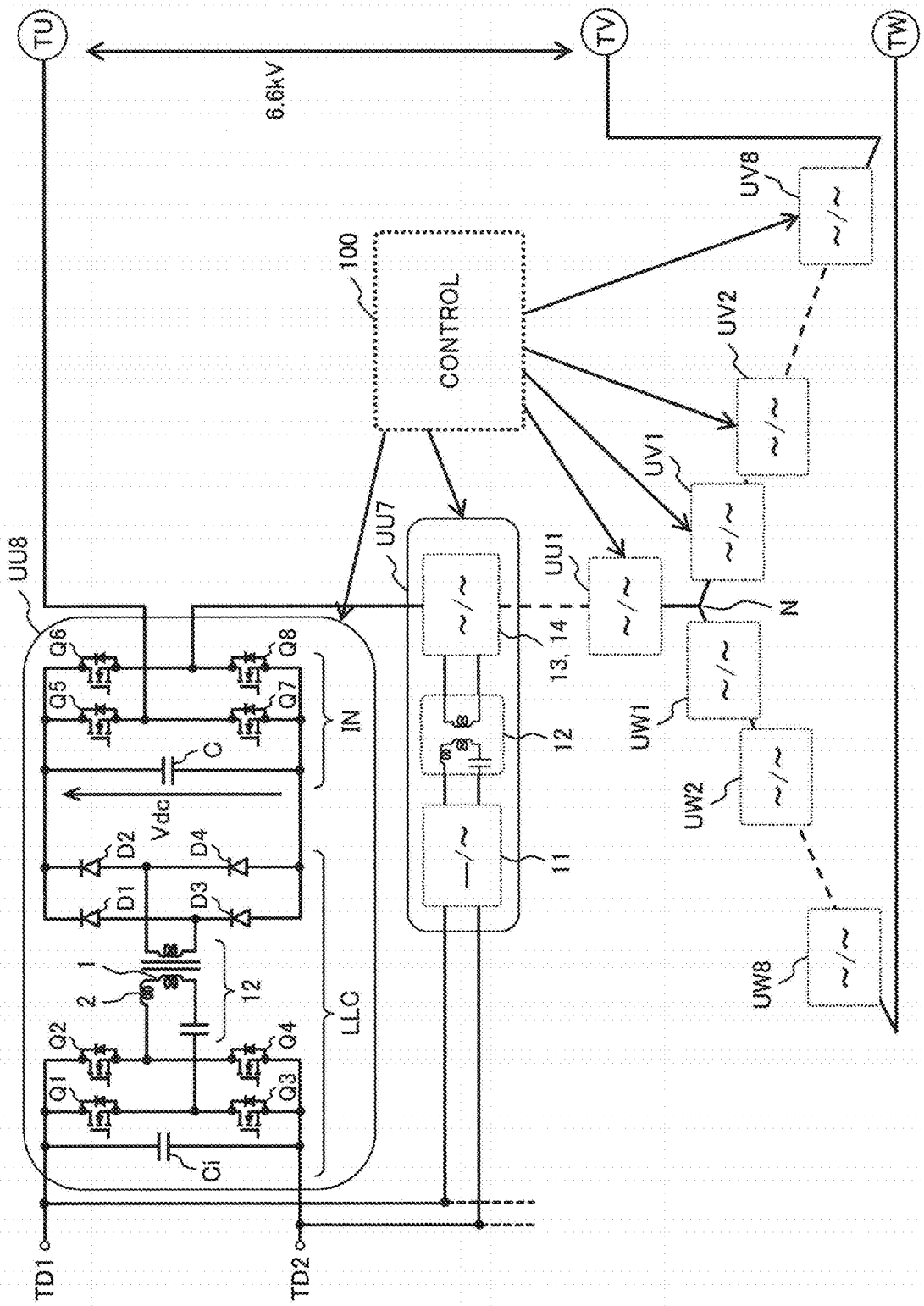
FIG. 5 is a drawing illustrating a configuration of an electric circuit in the power conversion device achieved by the connection in the power conversion device housing 100 configured as FIG. 3 or FIG. 4.

FIG. 5 illustrates a configuration of the electric circuit in the power conversion device achieved by the connection of the plurality of units in the power conversion device housing 100 configured as illustrated in FIG. 3 or FIG. 4. According to this configuration, the DC input terminals TD1 and TD2 of the respective power conversion units U are connected in parallel, and the AC output terminals TA1 and TA2 of the respective power conversion units U are connected in series, thus achieving, for example, a line-to-line voltage of 6.6 (kV) as the voltage in the electric power system. In this example, each of the phases shares the output of the line-to-line voltage of 6.6 (kV) with the eight power conversion units U, thus the power conversion units U each output the voltage of about 800 (V). A power conversion device housing control device 100 controls switching timings to the semiconductor devices in the plurality of power conversion units U in each of the phases. The power conversion device housing 100 illustrated in FIG. 2 can internally house the A power conversion device housing control device 100 with the plurality of power conversion units U.

While the power conversion device housing 100 in FIG. 1 houses the plurality of power conversion units, the following countermeasures are effective to achieve the arrangement in a small space.

First, relating to downsizing the power conversion unit U itself, the power conversion unit U includes the LLC resonant converter LLC and the single-phase inverter IN as main components as illustrated in FIG. 3 and similar drawing. It is not necessary to use the LLC resonant converter LLC, and a resonant converter may be used. In view of this, in the arrangement of these components, it is preferred to have a structure appropriate for a low-profile power conversion device housing 100 such that a lower substrate, on which components constituting a primary side circuit of an LLC transformer (insulation transformer) 12 are mounted, is disposed on a lower side, and an upper substrate, on which components constituting a secondary side circuit are mounted, is disposed on an upper side, via the LLC transformer (insulation transformer) 12 and an insulating material, so as to separate the low-voltage side from the high-voltage side, thus reducing the power conversion unit U in the height direction. In this configuration, a supporting member supports between a primary side substrate and a secondary side substrate, and the LLC transformer (insulation transformer) 12 is appropriately secured to be disposed between the primary side substrate and the secondary side substrate. Thus, a heat generated by these components can be discharged outside using a space formed between the upper and lower primary side substrate and secondary side substrate.

In FIG. 3, the plurality of power conversion units U constituting each of the phases are disposed in the horizontal direction of the power conversion device housing 100 and disposed in three stages one by one in the height direction for the respective phases, and single-phase inverter sides are electrically connected on right and left sides, so as to achieve a gradation configuration. One phase includes eight units, and the U-phase, the V-phase, and the W-phase are configured in a vertical direction of the power conversion device housing 100. The power conversion unit groups of the respective phases have one side as the high-voltage three-phase output to the system, and an opposite side as the neutral point on the Y-connection. The neutral point is grounded via a high resistance and becomes in a low-voltage electric potential. Disposing the DC input from the solar light and the breaker (MCCB) on the neutral point side ensures reduction of an insulation distance. While an air load break switch (LBS) can be disposed on the high-voltage three-phase output side as illustrated in FIG. 4, the air load break switch (LBS) may be configured as a separate body without disposing inside the power conversion device housing 100 as illustrated in FIG. 3.

Employing the above-described configuration ensures the low profile board structure installable under the solar panel PL as illustrated in FIG. 1. With a power conditioning system PCS according to the present invention that employs the configuration of FIG. 1, the power conditioning system PCS that has a function of a transformer ensuring stepping up to a high voltage and interconnection is installable near the solar panel PL, thus shortening a DC wiring from the solar panel to ensure loss reduction of the wiring compared with a conventional system. While a high voltage output wiring becomes longer than that of the conventional system, the high-voltage three-phase output can sufficiently reduce increase in high voltage wiring loss compared with the loss reduction effect on the DC wiring.

Since the power conversion device housing 100 of the present invention illustrated in FIG. 1 is installable under the solar panel, cooling against solar radiation, which needs to be taken into account in conventional outdoor board and container, can be reduced.

In the present invention, the outdoor installation further allows disposing a heat exchanger between the inside of the board (inside the housing) and the outside of the board (outside the housing) to prevent contamination inside the power conversion device housing 100 in which the high voltage terminals are included, thus ensuring sealing the inside of the board from external air so as to ensure the reduction of the insulation distance inside the board.

Figure 6:
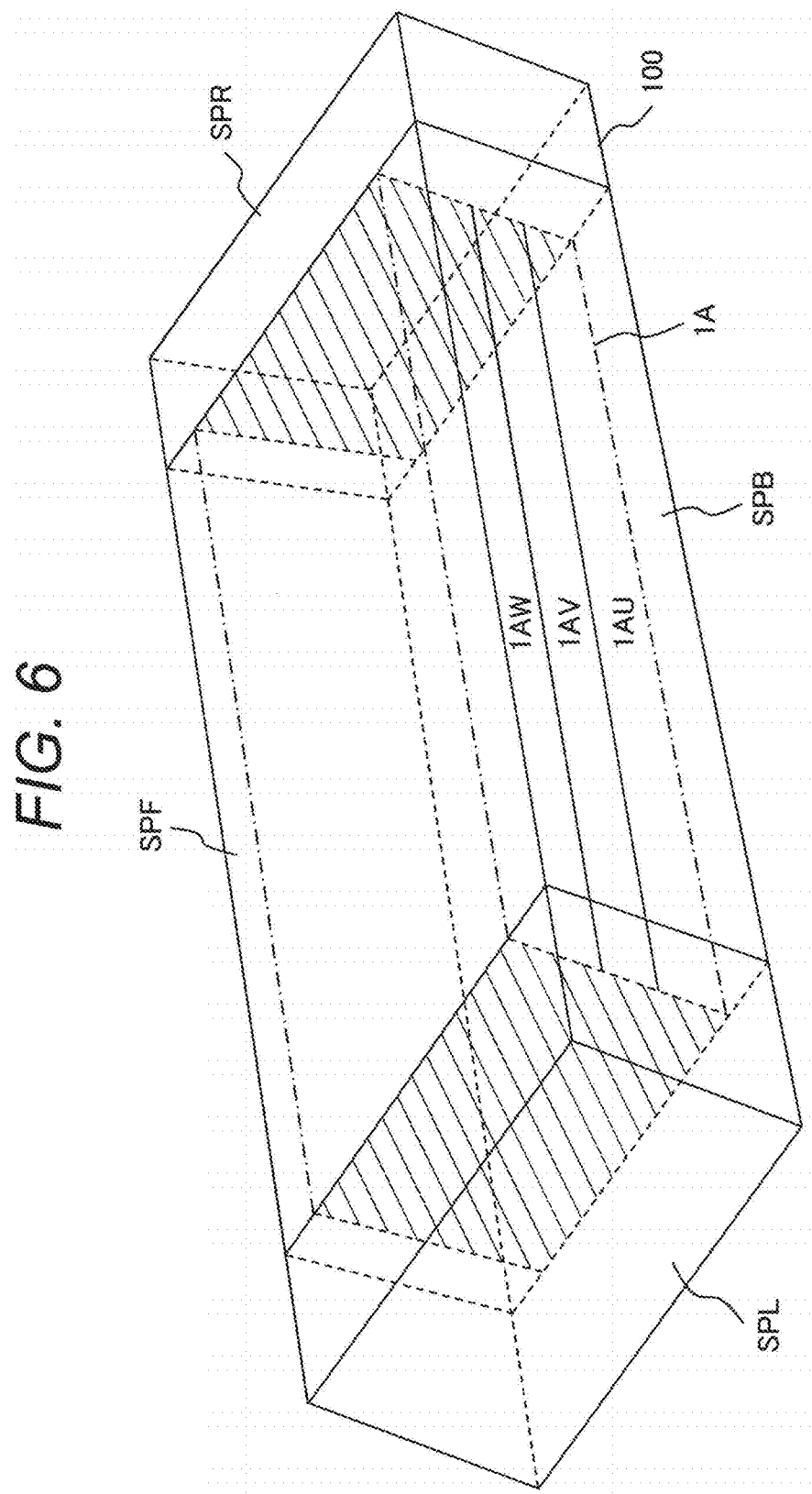
FIG. 6 is a drawing illustrating a mounting relationship between the power conversion device housing 100 and an internal three-phase power conversion unit group 1A.

FIG. 6 is a drawing illustrating a mounting relationship between the power conversion device housing 100 and an internal three-phase power conversion unit group 1A. The three-phase power conversion unit group 1A disposed inside the power conversion device housing 100 has the three-stage layered structure where power conversion unit groups 1AU, 1AV, and 1AW of the respective phases are disposed in the height direction. The three-phase power conversion unit group 1A is disposed so as to have spaces with the power conversion device housing 100 as an outer shell on front, back, right, and left sides when the three-phase power conversion unit group 1A is housed in the power conversion device housing 100. The spaces formed at this time are a right space SPR, a left space SPL, a front space SPF, and a back space SPB with respect to the longitudinal direction. An upper space and a lower space may be formed as necessary.

Figure 7:
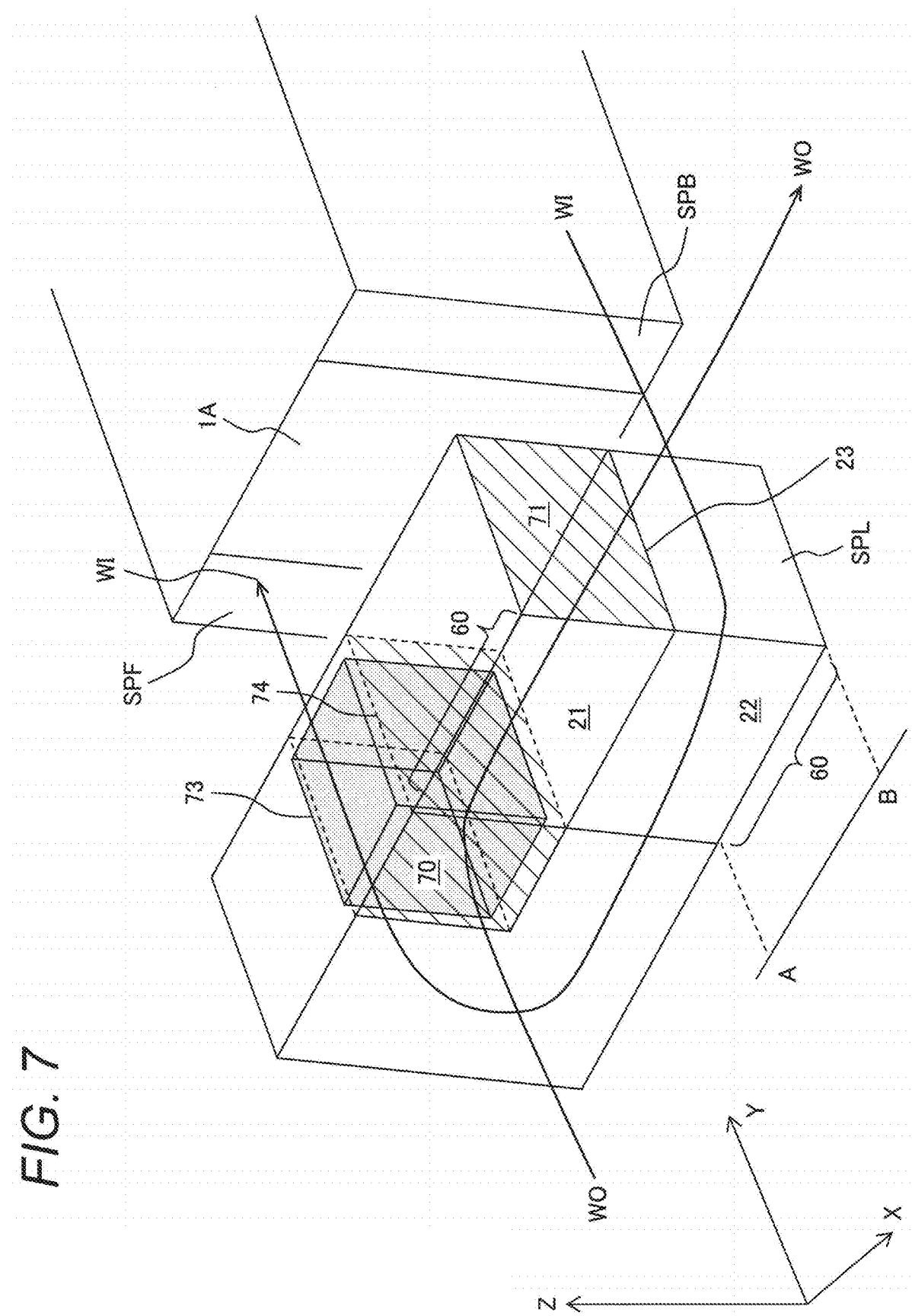
FIG. 7 is a drawing illustrating an exemplary cooling structure inside the power conversion device housing 100.

FIG. 7 illustrates an exemplary structure of the left space SPL in a cooling structure using these spaces inside the power conversion device housing 100. For convenience of explanation, the description will be given of the left space SPL separated from the front space SPF and the back space SPB. The cooling structure may be configured to be inserted into any position of the three-phase power conversion unit group 1A in a y-axis direction instead of the cooling structure disposed in the left space SPL or the right space SPR. However, in consideration of maintainability and cooling efficiency, the cooling structure is preferred to be disposed in the left space SPL or the right space SPR.

In FIG. 7, the left space SPL includes an external air inlet 70 illustrated with a hatched xz-plane and an external air outlet 71 illustrated with a hatched yz-plane. A wind tunnel 73 is formed at a region adjacent to the heat exchanger 60. The external air inlet 70 is formed on the xz-plane of the wind tunnel 73, and the wind tunnel 73 has a grayed surface on the yz-plane contacting the heat exchanger 60 formed as an opening 74 such that air is guided into the heat exchanger 60.

The heat exchanger 60 is a heat-pipe type heat exchanger. The heat-pipe type heat exchanger 60 is partitioned into upper and lower parts by a partition plate 23 disposed in a z-axis direction as described in detail in FIG. 10, and the heat-pipe type heat exchanger 60 includes an upper fin 21 and a lower fin 22. The partition plate 23 between the upper fin 21 (second fin region) and the lower fin 22 (first fin region) prevents the air passing through each of the upper fin 21 and the lower fin 22 from diffusing to the other fin region one another.

The cooling structure of this embodiment with the partition plate 23 forms two air flow routes of external air WO and internal air WI as illustrated in the drawing.

For the external air WO among them, a region illustrated by a solid line in FIG. 7 forms a wind tunnel 73, and the region has a zy-plane as the opening 74 facing the upper fin 21 as illustrated in gray. This causes the external air WO to reach the external air outlet 71 from the external air inlet 70 via the wind tunnel 73, the opening 74, and the upper fin 21 (the second fin region).

That is, the external air WO is guided into the external air inlet 70 from a −Y direction toward a +Y direction, after that, changes the flow direction into a +x-axis direction in the wind tunnel 73, and is guided into the upper fin 21 of the heat-pipe type heat exchanger 60 via the opening 74. The external air WO that has passed through the upper fin 21 is discharged from the external air outlet 71. The wind tunnel 73 may be provided extending to a yz-plane as an end surface of the left space SPL in a −x-axis direction, and in that case, the external air inlet 70 may be provided on not only the xz-plane but also the yz-plane so that the external air WO flows inside the wind tunnel 73 from the −x-axis direction to the +x-axis direction.

Meanwhile, in the back space SPB, internal air WI1 heated by cooling the three-phase power conversion unit group 1A exists, and the internal air WI1 flows into the lower fin 22 from a region of the back space SPB in contact with the lower fin 22. After the internal air WI is cooled by the lower fin 22, the internal air WI flows into the front space SPF across a space excluding the heat exchanger 60 and the wind tunnel 73 in the left space SPL. This embodiment has the above-described air flow route of the internal air WI because the cooling structure is disposed on the side surface side of the three-phase power conversion unit group 1A, the air as a heat source is guided into the cooling structure from the back space SPB, and the cooled air is guided into the front space SPF. However, the direction in which the air as the heat source is guided and the direction in which the cooled air is discharged may be any direction with respect to the lower fin 22.

The heat exchanger 60 and the wind tunnel 73 are disposed in the left space SPL on not the front space SPF side but the back space SPB side as illustrated in FIG. 7 because it is necessary to install various kinds of wirings and the like on the front space SPF side and the back space SPB side is appropriate for ensuring the space. However, the cooling effect of the present invention is provided even if the heat exchanger 60 and the wind tunnel 73 are disposed on the front space SPF side.

Figure 8:
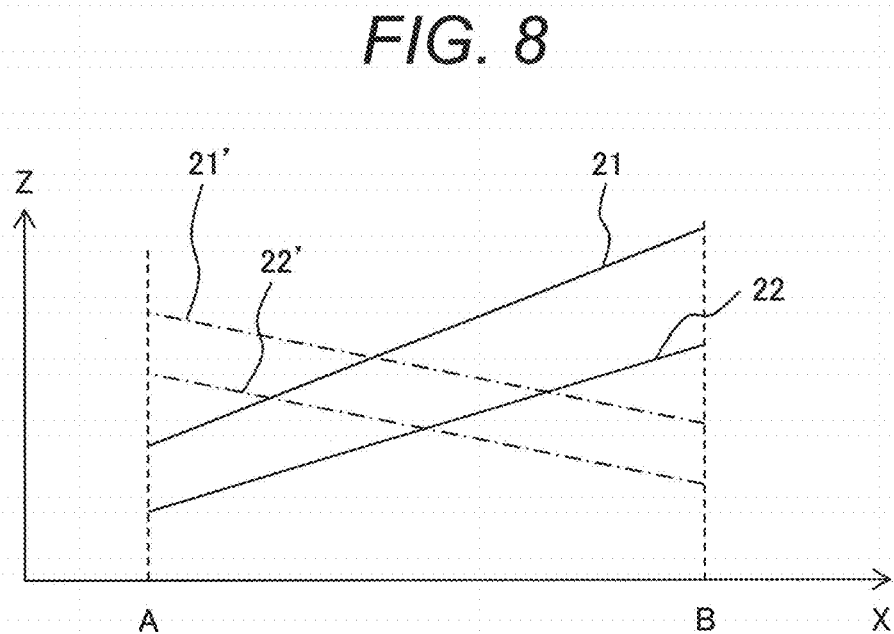
FIG. 8 is a drawing illustrating a heat distribution between A and B in an x-axis direction of a heat exchanger 60.

Here, in the cooling structure of this embodiment, FIG. 8 illustrates a heat distribution between A and B in the x-axis direction of the heat exchanger 60. As illustrated in FIGS. 7, A and B indicate ends of the heat exchanger 60 in the x-axis direction.

In the lower fin 22, the internal air WI is introduced from the B end side, and the internal air WI is cooled by the lower fin 22 and guided out from the A end to the space excluding the heat exchanger 60 and the wind tunnel 73 in the left space SPL. Accordingly, the lower fin 22 shows a temperature grade where the temperature decreases from the B end side toward the A end side.

Meanwhile, while the temperature increases due to the heat received by the lower fin 22 in the upper fin 21, the upper fin 21 shows a temperature grade where the temperature on the A end side is lower than the temperature on the B end side because of the cooling by the external air WO.

That is, an upper portion of a heat pipe 24 (not illustrated) is cooled when the external air WO passes through the upper fin 21 while a lower portion of the heat pipe 24 (not illustrated) is heated when the internal air WI passes through the lower fin 22, thus cooling the internal air WI.

The upper fin 21 and the lower fin 22 having the temperature grades as illustrated in FIG. 8 provide temperature difference in heat exchange between the upper fin 21 and the lower fin 22 via the heat pipe 24 approximately constant irrespective of a position on the x-axis, thus ensuring the efficient cooling.

The external air WO and the internal air WI may have the flow directions, in addition to the flow directions illustrated in FIG. 7, such that the external air WO is guided into the external air outlet 71 from the +x-axis direction and discharged from the external air inlet 70 while the air flow route is changed in the wind tunnel 73, and the internal air WI is guided into the back space SPB from the front space SPF via the lower fin 22. That is, it is only necessary that the flow directions in the upper fin 21 and the lower fin 22 in the x-axis direction are mutually inverse, and in this case, the temperature grades between A and B are indicated by negative inclinations of both two straight lines (one-dot chain lines 21' and 22') illustrated in FIG. 8, thus ensuring the efficient cooling as described above.

For an installation method of the heat pipe, the present invention is applicable to a top heat and a horizontal heat in addition to the above-described bottom heat, and in that case, it is only necessary that the air flow routes of the external air WO and the internal air WI are formed such that the cooling and heating regions are formed at the heat pipe as described above, and it is only necessary to employ the configuration of the cooling structure for that. Detailed descriptions for the configuration will be omitted here.

The above-described cooling structure ensures the efficient cooling of the air guided into the cooling fin via the cooling fin.

Figure 9:
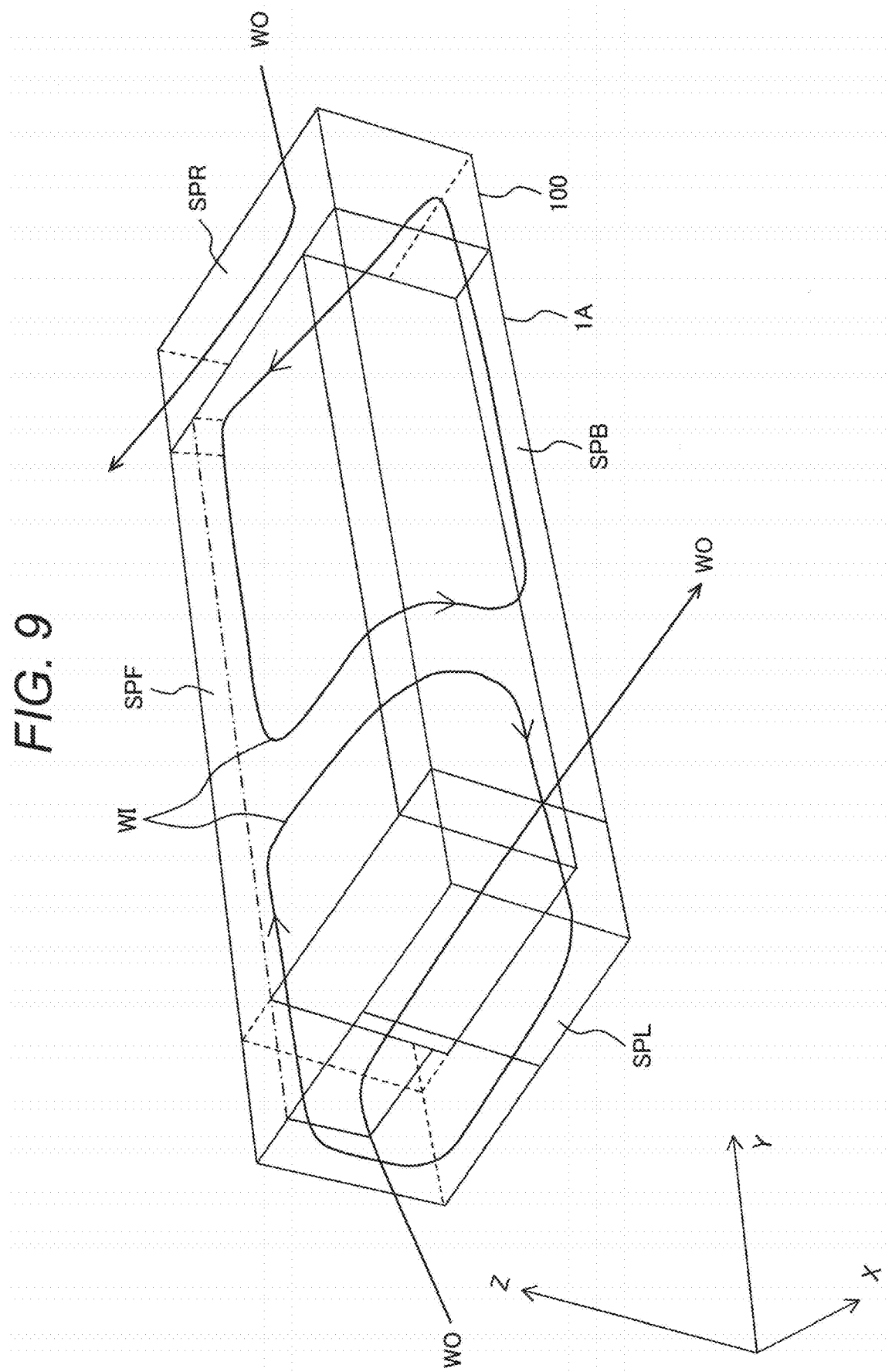
FIG. 9 is a drawing illustrating flows of internal air and external air in the whole power conversion device housing 100.

FIG. 9 illustrates flows of internal air and external air in the whole power conversion device housing 100. The internal air WI that has flown into the front space SPF from the left space SPL subsequently flows through the three-phase power conversion unit group 1A as a cooling object from the front space SPF toward the back space SPB to cool the three-phase power conversion unit group 1A, and the internal air WI becomes an excessively heated air to be flown into the heat-pipe type heat exchanger 60 again. While not illustrated here, the configuration may be such that the air is forced to be appropriately circulated for the efficient circulation from the front space SPF to the back space SPB passing through the three-phase power conversion unit group 1A. The right space SPR is basically identical to the left space SPL, thus the disclosure is omitted.

Thus, the present invention proposes the in-board cooling structure that has the structure where the heat-pipe type heat exchangers are disposed on both sides of the power conversion device housing 100 in the longitudinal direction and is appropriate for the low profile type. The configuration is employed such that the air that has cooled the three-phase power conversion unit group 1A is cooled in the right and left heat exchangers and circulated. As described above, it is only necessary that the flow directions of the external air WO and the internal air WI are mutually opposite.

Figure 10:
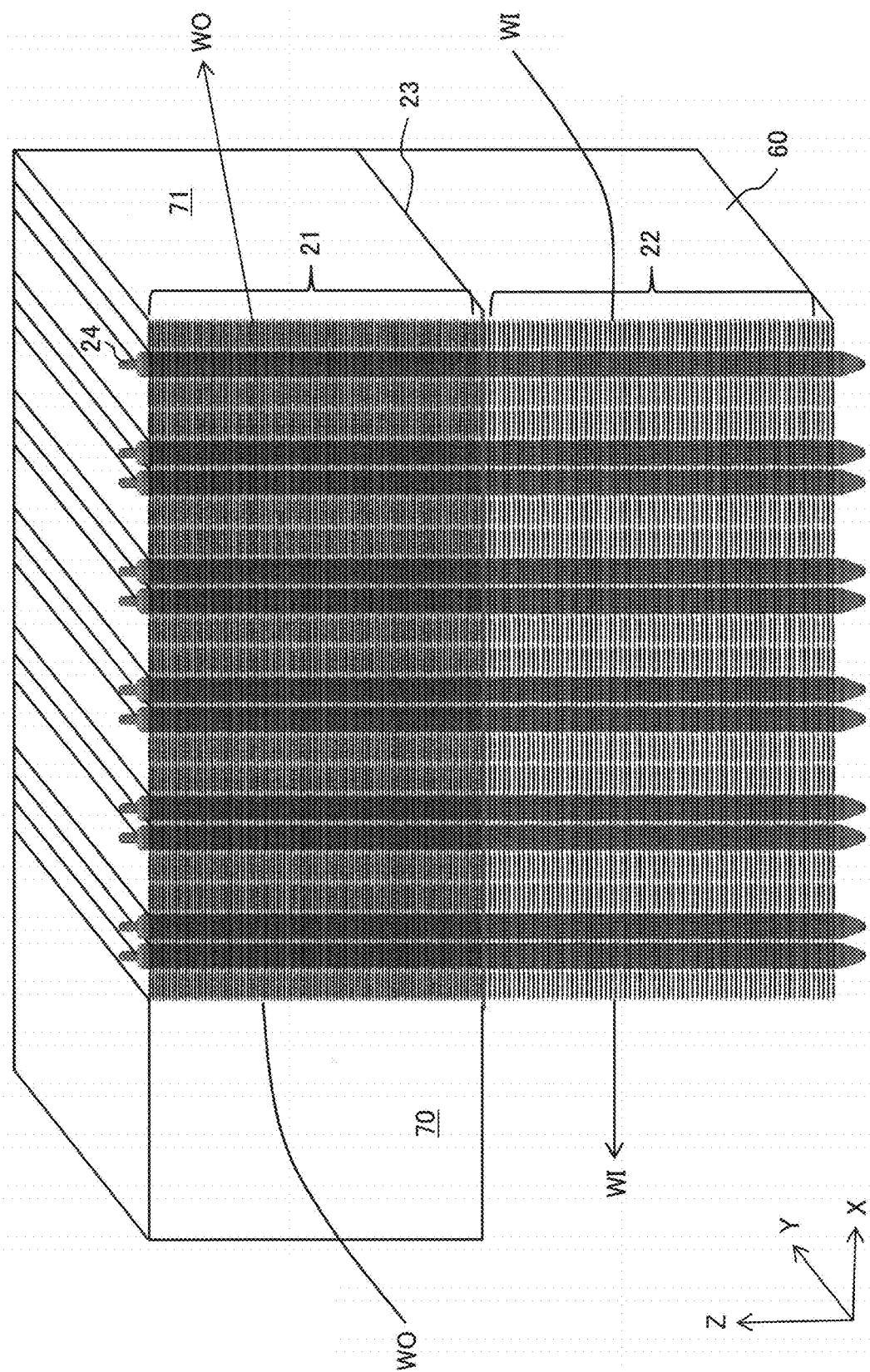
FIG. 10 is a drawing illustrating an exemplary heat-pipe type heat exchanger.

FIG. 10 illustrates an exemplary heat-pipe type heat exchanger preferred to be employed in this case. The heat-pipe type heat exchanger 60 has a structure where the upper fin 21 and the lower fin 22 thermally connected by the heat pipe 24 are pneumatically separated by the partition plate 23. The partition plate 23 is disposed on a xy-plane so as to divide the heat exchanger 60 into two in the z-axis direction, and may have a size approximately identical to or larger than an area of the xy-plane of the heat exchanger 60. In the example in the drawing, the upper portion of the heat pipe 24 is cooled when the external air WO passes through the upper fin 21 while the lower portion of the heat pipe 24 is heated when the internal air WI passes through the lower fin 22, thus cooling the internal air WI. In the structure, fin intervals of the upper fins 21 are configured to have narrow pitches compared with the lower fins so as to decrease a pressure loss of the lower fin. This is because the pressure loss is preferred to be decreased as much as possible since the air that has passed through the lower fin 22 is required to be guided into the three-phase power conversion unit group 1A again to cool the three-phase power conversion unit group 1A. The pitches may be identical insofar as no problem arises in the pressure loss.

Figure 11:
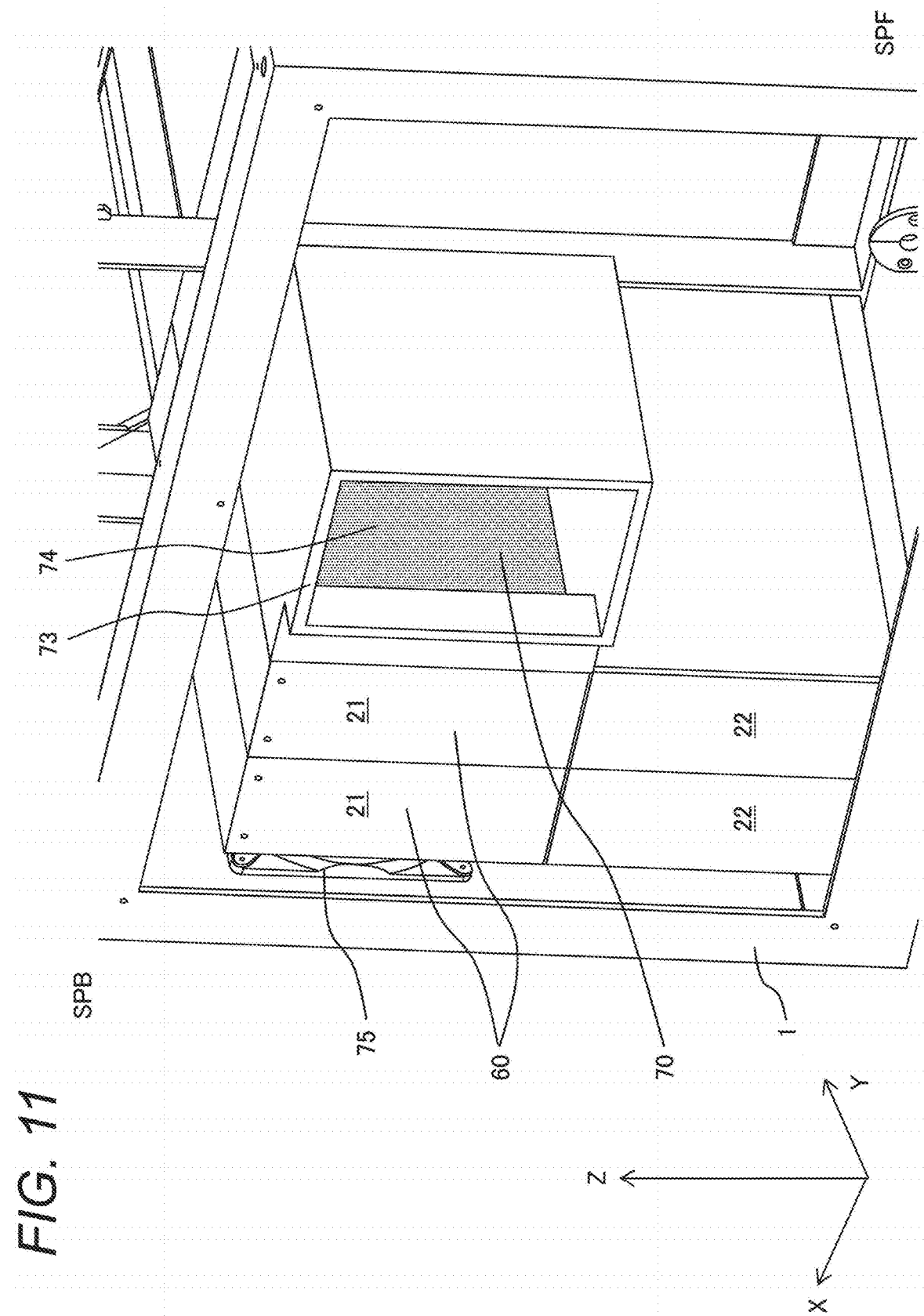
FIG. 11 is an external view of a right space SPR illustrating a specific arrangement example.

FIG. 11 is an external view of a right space SPR illustrating a specific arrangement example. In FIG. 11 illustrating the right space SPR in the power conversion device, the appearance where the heat-pipe type heat exchanger 60 is assembled in the power conversion device housing 100 is illustrated. On an xz-plane of the right space SPR at an end on an opposite side of the power conversion device side, a plate may be disposed, while this drawing illustrates a state where the plate is removed. The structure is such that the air (internal air WI) having the increased temperature after cooling the three-phase power conversion unit group 1A enters the lower fin 22 as an inside of the power conversion device housing 100, and the air (internal air WI) transmits the heat to the upper fin 21 as an external air side through the heat pipe 24, so as to cool the air inside the power conversion device housing 100. The upper fin 21 as the external air WO side has the cooling structure of forced air cooling where the external air inlet 70 on an inlet side separately introduces the external air with a duct, and a fan 75 is disposed on the external air outlet 71 side. While the lower fin 22 is assumed to have a structure where the wind is flown by the fan for the forced air cooling of the three-phase power conversion unit group 1A, since the pressure loss increases in the structure, a structure where a fan is additionally disposed to the lower fin 22 portion as well may be employed. While it is assumed that axial fans are used as the respective fans, a centrifugal fan configured to allow larger pressure loss may be used, and it is only necessary that a fan has a similar function. The illustrated number of the fans may be increased and decreased depending on the type of the above-described fans or the actual usage.

This structure is a structure where the air having the increased temperature after cooling the three-phase power conversion unit group 1A strikes a board back surface and flows toward right and left heat pipe fins. Therefore, this structure ensures the in-board cooling with the board back surface and board side surfaces having a heat exchanging function with the outside of the board.

Example 2

In Example 1, basic matters in the power conversion device of the present invention have been described as representative cases. In Example 2, further modifications on the configuration and the specification of the power conversion device will be described.

While the power conversion device according to the present invention is preferred to be housed in the power conversion device housing 100 to have the exemplary configuration as illustrated in FIG. 3 and FIG. 4, the power conversion device may be further changed and used as follows.

First, the examples illustrated in FIG. 3 and FIG. 4 are configured such that the single-phase inverter IN is applied to a latter part of the full-bridge type LLC resonant converter LLC having the inputs in parallel connection, and the single-phase inverter IN is configured in the gradation configuration to perform the high voltage output. The gradation configuration is assumed as a Y-connection type, and the number of stages of the gradation is assumed as eight stages, while the configuration is not limited to them. The neutral point N of the Y-connection may be grounded or grounded with high resistance, while the configuration is not limited to them. The high voltage output with the eight-stage gradation configuration is assumed as an output of 6.6 kV, while other voltages may be employed by, for example, changing the number of configurations.

Since the DC voltage Vd1 provided from the full-bridge type LLC resonant converter LLC is a DC voltage of 1500 V or less, it is assumed that MOSFETs appropriate for high frequency driving are applied to the semiconductor devices Q1, Q2, Q3, and Q4. A switching frequency is assumed to be several tens of kHz to several hundreds of kHz. As the MOSFET to be used, a SiC-MOSFET appropriate for a high-voltage and high-frequency switching may be applied, or other MOSFETs having similar function may be applied. The secondary side of the LLC resonant converter LLC is assumed to be a rectifying and smoothing circuit with diodes. In addition to a Si-diode, for reducing the conduction loss, a Si-type Schottky barrier diode or a Sic-Schottky barrier diode may be applied, or the SiC-MOSFETs may be used in synchronization for the loss reduction. Another component may be employed insofar as the component has a similar function.

The LLC resonant type insulation transformer 12 has an insulation function from the system voltage, and has a configuration where, for the LLC resonance, the excitation inductance 1 of the high frequency transformer is connected in series to the leakage inductance 2 and the resonant capacitor 3 adapted for resonance. While the leakage inductance 2 is assumed to have a configuration integrated inside the high frequency transformer as a structure configured to adjust a constant of a leakage flux inside the high frequency transformer, the configuration is not limited to this. While a film capacitor or a ceramic capacitor is assumed to be used for the resonant capacitor 3, it is only necessary to employ a capacitor having similar function.

The single-phase inverter IN at the latter part of the LLC resonant converter LLC is an inverter of a hard switching while the switching frequency is low, different from the LLC resonant converter LLC. Therefore, it is assumed to apply the MOSFET with the low switching loss to the semiconductor devices Q5, Q6, Q7, and Q8. As the MOSFET to be used, a SiC-MOSFET appropriate for a high-voltage and high-frequency switching may be applied, or an IGBT for a high-frequency driving or another component having similar function may be employed.

Example 3

Figure 12:
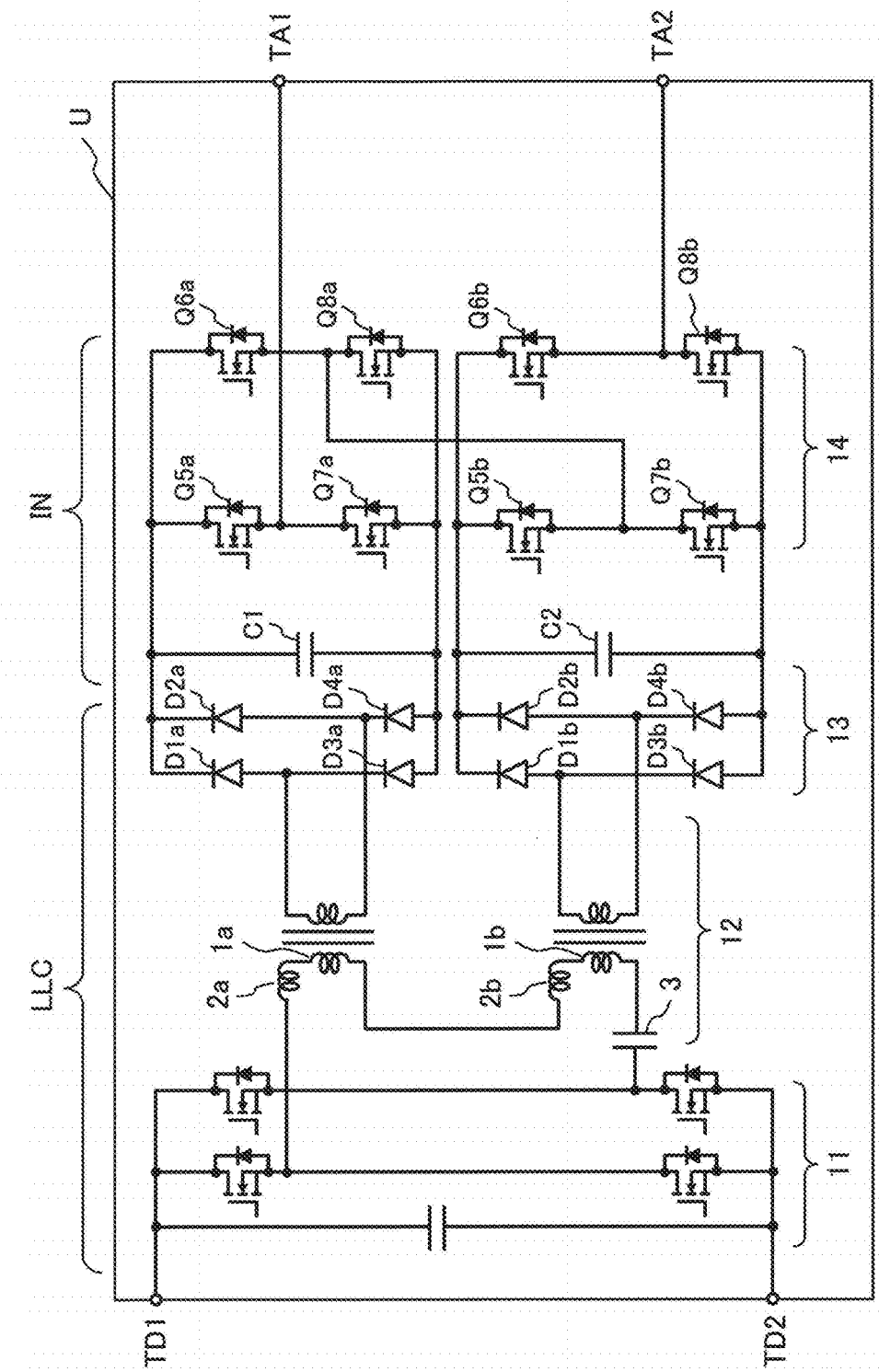
FIG. 12 is a drawing illustrating a circuit configuration of a two-in-one unit assuming a low input current for a circuit configuration inside the power conversion unit U.
Figure 13:
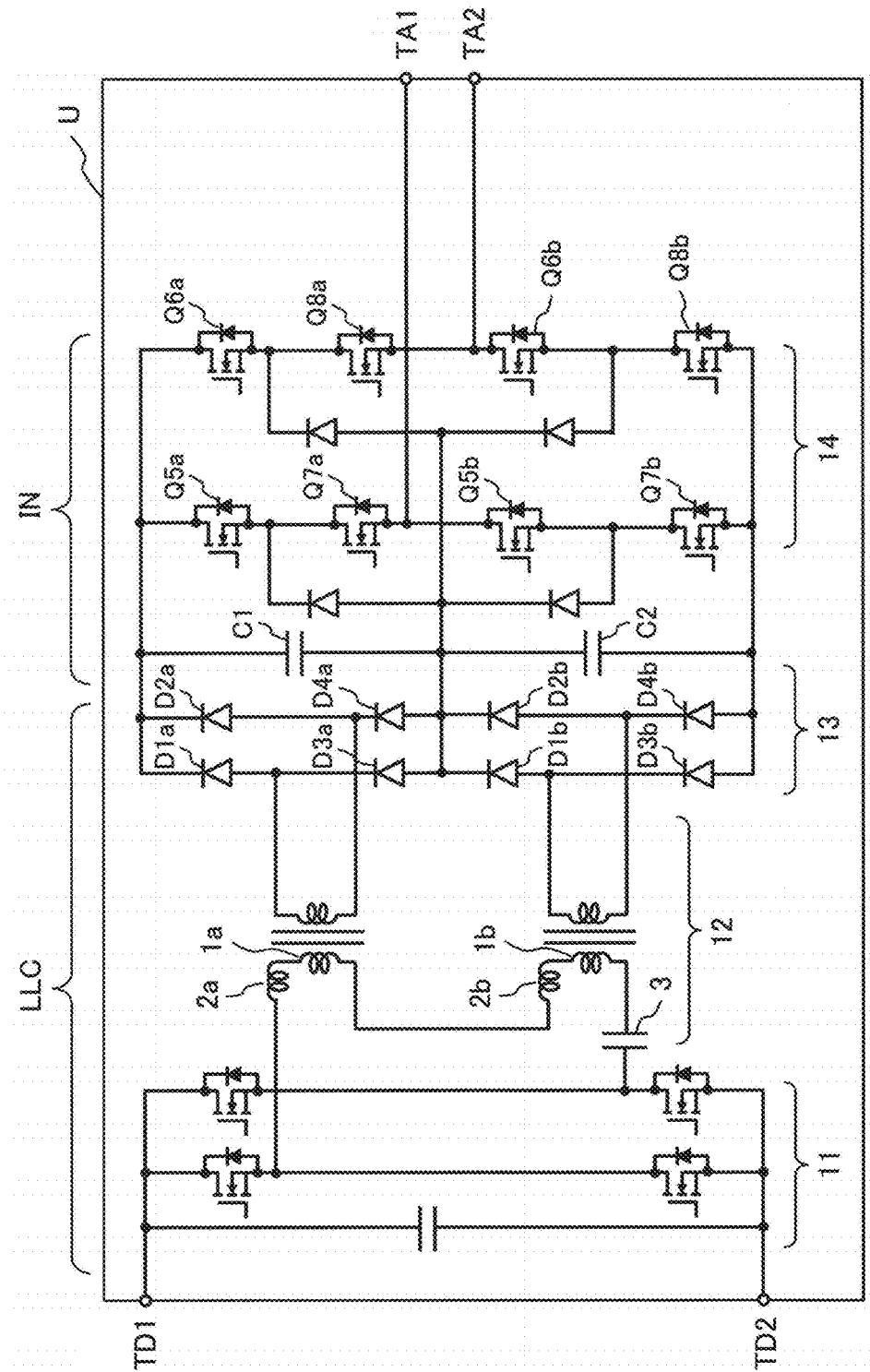
FIG. 13 is a drawing illustrating the circuit configuration inside the power conversion unit U where two stages of the single-phase inverters are configured as a three-level inverter.
Figure 14:
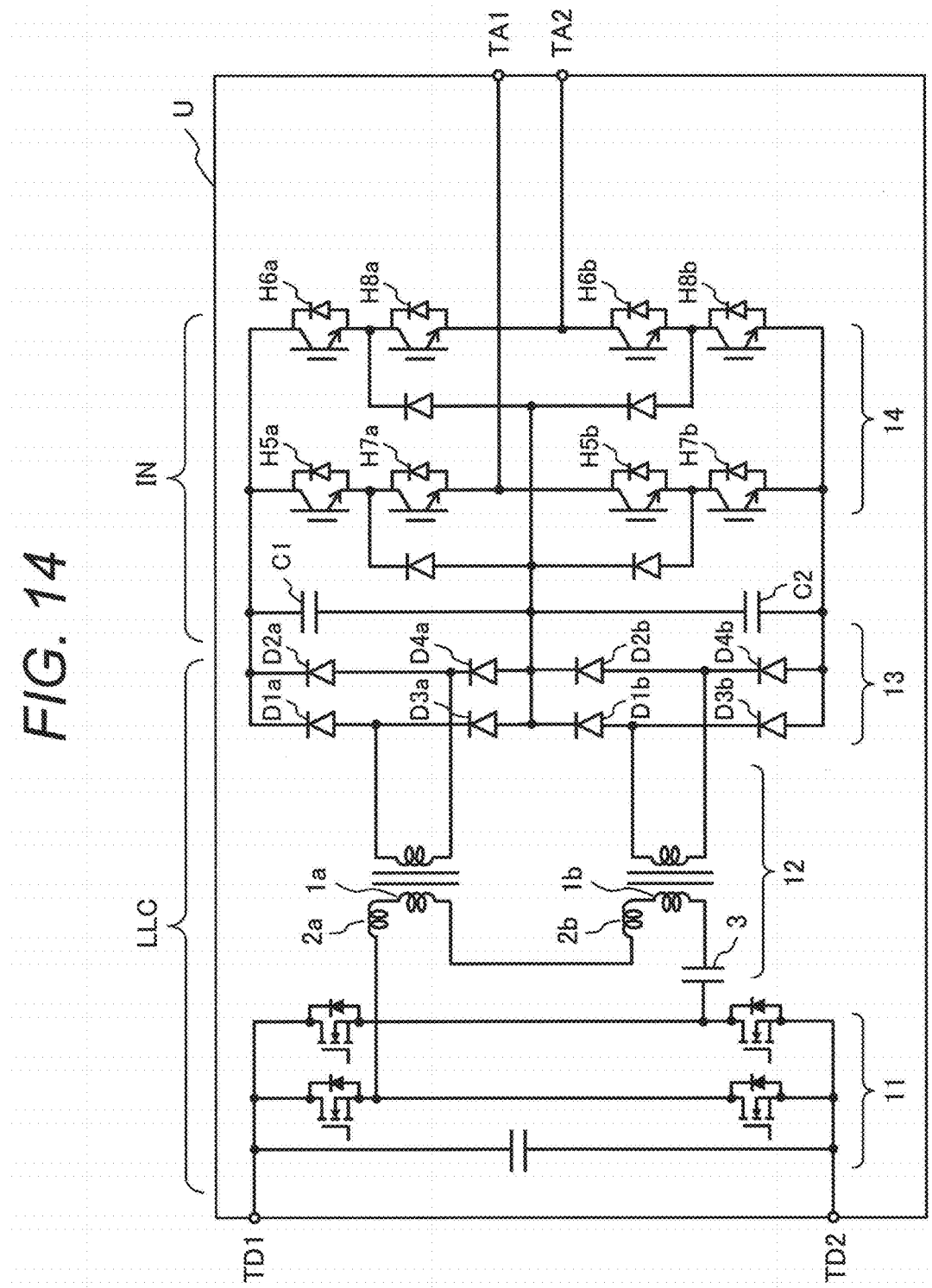
FIG. 14 is a drawing illustrating an exemplary circuit configuration inside the power conversion unit U configured with an IGBT.

Furthermore, as Example 3, for the circuit configuration inside the power conversion unit U, various kinds of circuit configurations exemplified in FIG. 12 to FIG. 14 can be employed.

First, for the circuit configuration inside the power conversion unit U of FIG. 12, this circuit configuration is a circuit configuration with a two-in-one unit assuming a case of a small input current at when the input voltage is rated to 1500 V.

Here, the full-bridge type LLC resonant converter LLC having the input for the parallel connection is configured such that the two primary side insulation transformers 12 are connected in series connection, and the secondary sides of the two insulation transformers 12 are connected to the rectifier circuits 13 and the inverter circuits IN in parallel two systems. Specifically, the respective single-phase inverters are applied at the latter parts of the rectifier circuits that receive the outputs from the respective insulation transformers, and the two stages of the single-phase inverters are configured as one unit. This circuit configuration ensures sharing structural members, thus ensuring downsizing and weight reduction of the unit structure. The two insulation transformers having identical primary side currents reduce variation of an electric power balance of the two stages.

For the circuit configuration inside the power conversion unit U of FIG. 13, this circuit configuration is a configuration where two stages of the single-phase inverters are configured as a three-level inverter, and ensures providing the effect similar to that of FIG. 12. Since the driving frequencies of the inverters are ⅒ or less compared with that of the LLC resonant converter LLC, the IGBTs (H5a, H6a, H7a, H8a, H5b, H6b, H7b, and H8b in FIG. 14) can be used at the parts of the MOSFETs (Q5a, Q6a, Q7a, Q8a, Q5b, Q6b, Q7b, and Q8b in FIG. 12) of the three-level inverter instead of the SiC-MOSFETs as illustrated in FIG. 14. When the semiconductor device can withstand double voltage, a new three-level inverter configuration may be used.

Figure 15:
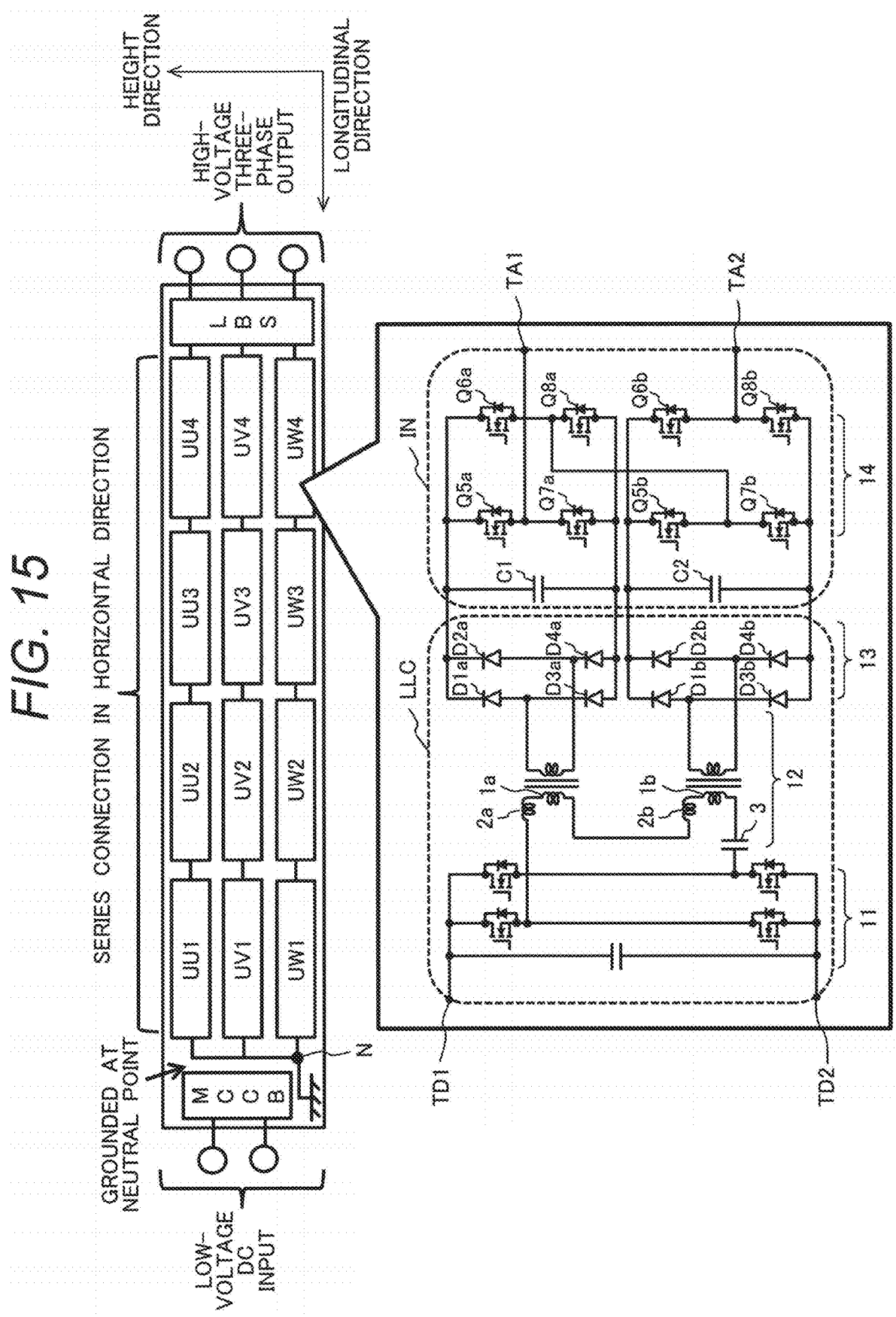
FIG. 15 is a drawing illustrating an exemplary connection of a plurality of power conversion units U in a power conversion device housing 100 in the case of employing Example 3.

A description will be given of an exemplary connection of the plurality of power conversion units U in the power conversion device housing 100 when Example 3 is employed, by referring to FIG. 15. In this case, the power conversion units in each of the phases are disposed in the horizontal direction of the board, and the single-phase inverter sides are electrically connected on the right and left sides to ensure the gradation configuration. Therefore, Example 3 where the two-in-one unit is applied is different from Example 1, and configured such that the four power conversion units in series connection are configured as one phase, and the U, V, and W phases are configured in the height direction of the power conversion device housing 100. This is a configuration where the number of connections of power lines between the unit cells and the number of connections outside the units, for example, signal lines can be reduced.

Example 4

Figure 16:
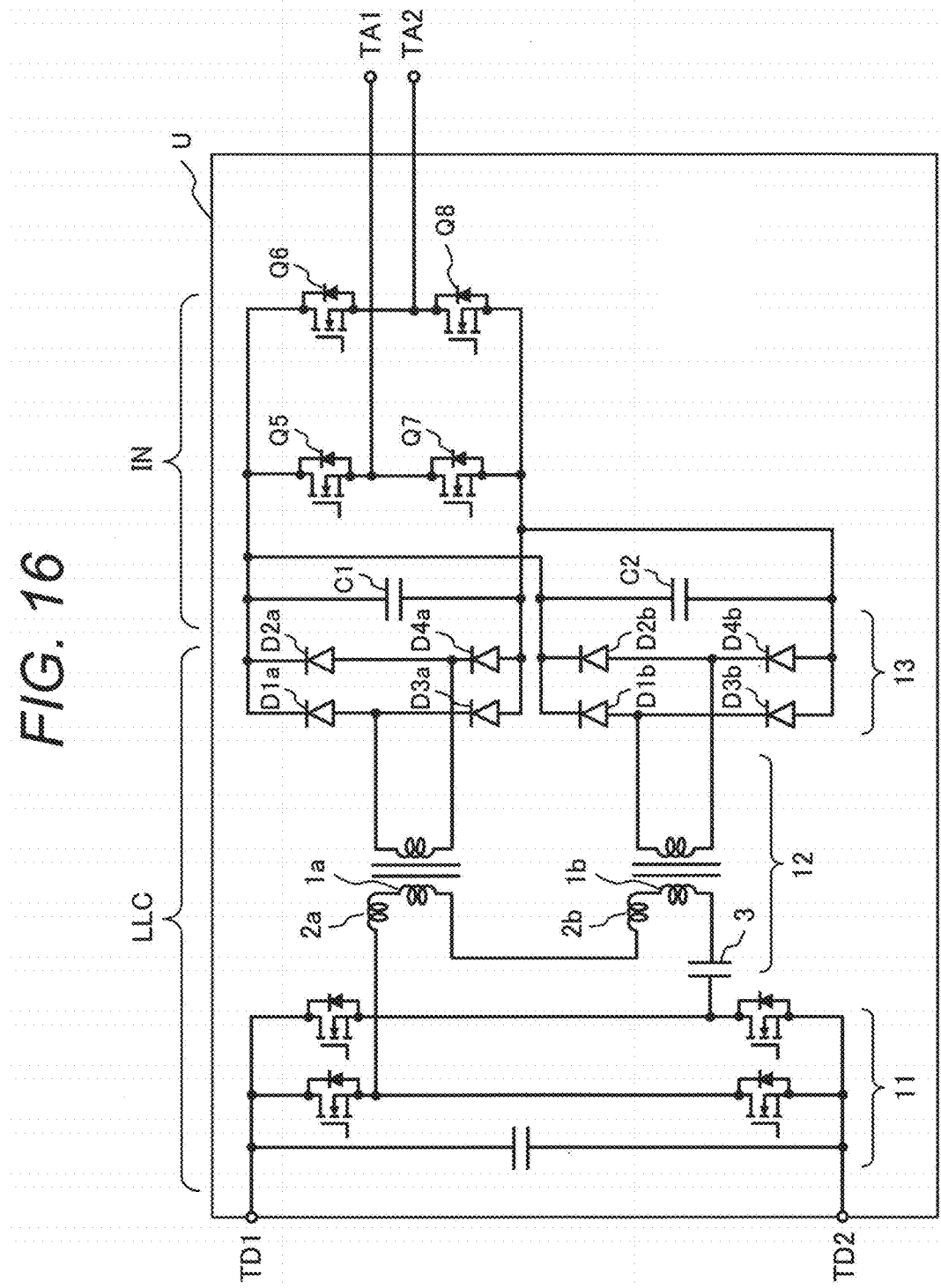
FIG. 16 is a drawing illustrating the circuit configuration inside the power conversion unit U where a transformer and a rectifier circuit are connected in parallel.

Furthermore, as Example 4, FIG. 16 illustrates an exemplary circuit configuration in the power conversion unit U. The circuit configuration of FIG. 16 is a circuit configuration of a unit assuming a case of a small input current at when the input voltage is rated to 1500 V.

In FIG. 16, while the rectifier circuit 13 is doubled, the inverter IN is shared. In this case, the full-bridge type LLC resonant converter LLC having the inputs for the parallel connection is configured such that the transformers 12 are connected in two series connections at the primary side, the rectifier circuits 13 are configured in parallel at the latter parts of the respective LLC transformers 12, and the inverter IN is shared, so as to ensure power output equivalent to that of two transformers with one unit. This configuration ensures an increased capacity, and ensures downsizing and weight reduction per capacity as a result of the increased capacity. The two transformers having identical primary side currents reduce variation of an electric power balance of two stages.

The single-phase inverter IN at the latter part of the LLC resonant converter LLC is an inverter of a hard switching while the switching frequency is low, different from the LLC resonant converter LLC. Therefore, it is assumed to apply the MOSFET with the low switching loss. As the MOSFET to be used, a SiC-MOSFET appropriate for a high-voltage and high-frequency switching may be applied, or an IGBT for a high-frequency driving or another component having similar function may be employed.

While the board structure of the power conversion device housing 100 is assumed to have the configuration with eight units similar to Example 1, the configuration is not limited this. While the description has been given with multiple embodiments, the contents described in the above-described embodiments may be used in combinations corresponding to applications.

REFERENCE SIGNS LIST

1 . . . excitation inductance,
2 . . . leakage inductance,
3 . . . resonant capacitor,
11 . . . inverter circuit,
12 . . . insulation transformer,
13 . . . rectifier circuit,
14 . . . inverter circuit,
21 . . . upper fin,
22 . . . lower fin,
23 . . . partition plate,
24 . . . heat pipe,
60 . . . heat-pipe type heat exchanger,
70 . . . external air inlet,
71 . . . external air outlet,
75 . . . fan,
100 . . . power conversion device housing,
B, BB . . . base,
C . . . capacitor,
Ci . . . input side capacitor,
D1, D2, D3, D4 . . . diode,
IN . . . inverter,
LLC . . . LLC resonant converter,
PL . . . solar panel,
Q1, Q2, Q3, Q4, Q5, Q6, Q7, Q8 . . . semiconductor device,
SPR, SPL, SPF, SPB . . . space,
TD1, TD2 . . . DC input terminal,
TL1, TL2 . . . DC output terminal,
TA1, TA2 . . . AC output terminal,
TU, TV, TW . . . three-phase AC output terminal,
U . . . power conversion unit,
WI . . . internal air,
WO . . . external air

The invention claimed is:

1. A power conversion device,
wherein a power conversion unit includes a single-phase inverter on a secondary side of a resonant type converter that has an input of a direct current, a power conversion unit group is configured by connecting outputs of the single-phase inverters of a plurality of power conversion units in series, and respective phases of three phase alternate current are formed with three power conversion unit groups housed in a power conversion device housing,
the plurality of power conversion units constituting the power conversion unit group are disposed along a longitudinal direction of the power conversion device housing, and the respective three power conversion unit groups are disposed at an upper stage, a middle stage, and a lower stage in a height direction of the power conversion device housing, and
the power conversion device housing has one end side in the longitudinal direction as an output terminal for the three power conversion unit groups, and the power conversion device housing has the other end side in the longitudinal direction where terminals of the three power conversion unit groups are connected in common.

2. The power conversion device according to claim 1, comprising a DC breaker on a DC input side of the power conversion unit.

3. The power conversion device according to claim 1, comprising an air load break switch on the output terminal side of the power conversion unit group.

4. The power conversion device according to claim 1, wherein the resonant type converter includes two resonant transformers, and primary sides of the two resonant transformers are connected in series.

5. The power conversion device according to claim 4, wherein the two resonant transformers have secondary sides that each include a single-phase inverter so as to form a gradation connection of two stages.

6. The power conversion device according to claim 4, wherein the resonant transformers each have a secondary side as a latter part where rectifications have been performed with diodes, the latter parts are connected in series, and a three-level inverter is disposed on the latter part.

7. The power conversion device according to claim 4, wherein the resonant transformer has a secondary side as a latter part where rectifications have been performed with respective diodes and a parallel connection is established.

8. The power conversion device according to claim 1, wherein the power conversion device housing is installed at a solar power generation site, and the power conversion device housing has a low profile type structure configured to be disposed at a shade of a solar panel supported by a base.

9. A power supply device,
wherein a power conversion unit includes a single-phase inverter on a secondary side of a resonant type converter that has an input of a direct current, a power conversion unit group is configured by connecting outputs of the single-phase inverters of a plurality of power conversion units in series, and respective phases of three phase alternate current are formed with three power conversion unit groups housed in a power conversion device housing,
the plurality of power conversion units constituting the power conversion unit group are disposed along a longitudinal direction of the power conversion device housing, and the respective three power conversion unit groups are disposed at an upper stage, a middle stage, and a lower stage in a height direction of the power conversion device housing,
the power conversion device housing has one end side in the longitudinal direction as an output terminal for the three power conversion unit groups, and the power conversion device housing has the other end side in the longitudinal direction where terminals of the three power conversion unit groups are connected in common, and
heat exchangers are disposed on right and left sides of the power conversion device housing in the longitudinal direction, the heat exchangers have fin structures connected to heat pipes, a first fin region contacting internal air heated by the power conversion unit groups in the power conversion device housing and a second fin region contacting external air are connected by the heat pipe so as to circulate the cooled internal air in the power conversion device housing.

* * * * *